(12) United States Patent
Nair et al.

(10) Patent No.: US 7,521,308 B2
(45) Date of Patent: Apr. 21, 2009

(54) DUAL LAYER STRESS LINER FOR MOSFETS

(75) Inventors: Deleep R. Nair, Wappingers Falls, NY (US); Christopher V. Baiocco, Newburgh, NY (US); Xiangdong Chen, Poughquag, NY (US); Junjung Kim, Fishkill, NY (US); Jae-eun Park, Fishkill, NY (US); Daewon Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 11/616,147

(22) Filed: Dec. 26, 2006

(65) Prior Publication Data

US 2008/0153217 A1 Jun. 26, 2008

(51) Int. Cl.
*H01L 21/8238* (2006.01)

(52) U.S. Cl. .............. 438/199; 438/736; 438/738; 438/743; 438/744

(58) Field of Classification Search ............ None
See application file for complete search history.

(56) References Cited

U.S. PATENT DOCUMENTS

| | | | | |
|---|---|---|---|---|
| 7,022,561 | B2* | 4/2006 | Huang et al. | 438/197 |
| 2004/0029323 | A1* | 2/2004 | Shimizu et al. | 438/142 |
| 2005/0093030 | A1* | 5/2005 | Doris et al. | 257/288 |
| 2006/0113641 | A1* | 6/2006 | Hohage et al. | 257/640 |
| 2006/0160371 | A1 | 7/2006 | Zhu | |
| 2006/0214225 | A1 | 9/2006 | Holt et al. | |

\* cited by examiner

*Primary Examiner*—Zandra Smith
*Assistant Examiner*—Khanh B Duong
(74) *Attorney, Agent, or Firm*—Gibb IP Law Firm, LLC; Yuanmin Cai, Esq.

(57) ABSTRACT

A method of producing a metal oxide semiconductor field effect transistor (MOSFET) creates a transistor by patterning a gate structure over a substrate, forming spacers on sides of the gate structure, and forming conductor regions within the substrate on alternate sides of the gate stack. The gate structure and the conductor regions make up the transistor. In order to reduce high power plasma induced damage, the method initially applies a first plasma having a first power level to the transistor to form a first stress layer over the transistor. After the first lower-power plasma is applied, the method then applies a second plasma having a second power level to the transistor to from a second stress layer over the first stress layer. The second power level is higher (e.g., at least 5 times higher) than the first power level.

3 Claims, 1 Drawing Sheet

DUAL LAYER STRESS LINER FOR MOSFETS

BACKGROUND

1. Field of the Invention

The embodiments of the invention generally relate to metal oxide semiconductor field effect transistors (MOSFETS), and, more particularly, to an improved method of forming a stressing layer without damaging the underlying transistor and without compromising its performance.

2. Description of the Related Art

Modern day logic transistors are exposed to plasma damage at many stages of processing. This plasma damage is aggravated due to the usage of more plasma processing steps, such as with the introduction of plasma generated stress liners which improve logic performance by carrier hole mobility enhancement. High-power high density plasma-based films (HDP) have an advantage over conventional plasma enhanced chemical vapor deposition (PECVD) films, because they reduce the performance offset between isolated and nested devices. However, exposing transistors to high-power plasma processes can sometimes affect the overall reliability of the transistors. In fact there is sometimes a remarkable decrease in reliability and performance in terms of thick gate oxide breakdown, enhanced bias temperature instability (NBTI), and other problems because of such high-power plasma-based films.

SUMMARY

In view of the foregoing, an embodiment of the invention provides a method of producing a metal oxide semiconductor field effect transistor (MOSFET). The method creates a transistor by patterning a gate structure over a substrate, forming spacers on sides of the gate structure, and forming conductor regions within the substrate on alternate sides of the gate stack. The gate structure and the conductor regions make up the transistor. In order to reduce high power plasma induced damage, the method initially applies a first plasma having a first power level to the transistor to form a first stress layer over the transistor. After the first lower-power plasma is applied, the method then applies a second plasma having a second power level to the transistor to form a second stress layer over the first stress layer. The second power level is higher (e.g., at least 5 times higher) than the first power level.

One feature of the invention is that the first plasma and the second plasma have the same chemical structure (yet are applied at different power levels). Thus, the first stress layer and the second stress layer comprise similar materials. The plasma processes both comprise high density plasma (HDP) processes.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
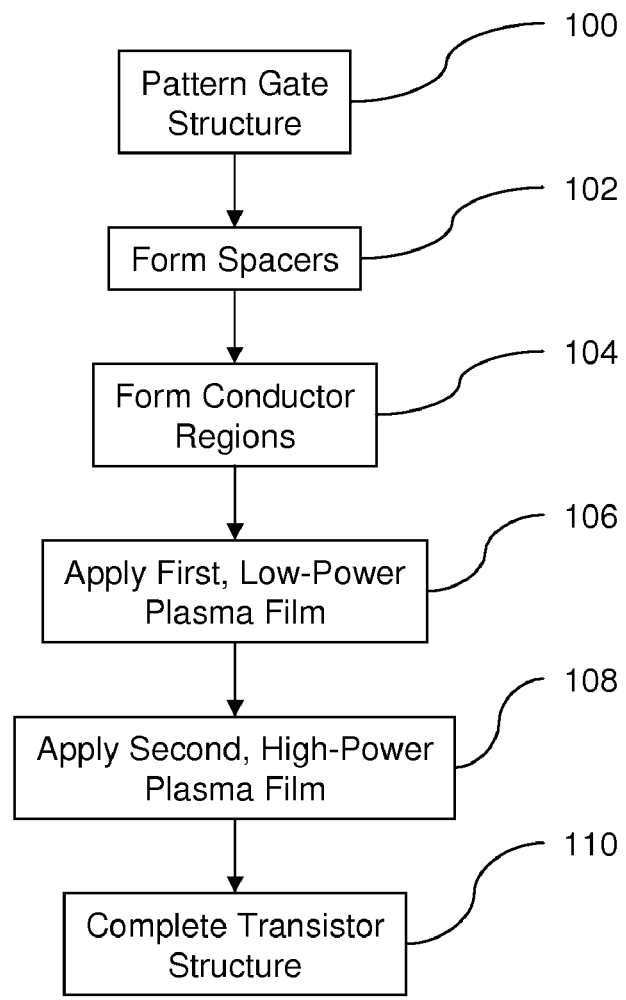
FIG. 1 is a flow diagram illustrating a method embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, transistors are exposed to potential plasma damage at many stages of processing. This plasma damage is aggravated due to the usage of more plasma processing steps, such as with the introduction of plasma generated stress liners. High-power high density plasma-based films (HDP) have an advantage over conventional plasma enhanced chemical vapor deposition (PECVD) films because they reduce the performance offset between isolated and nested devices. However, exposing transistors to high-power plasma processes can sometimes affect the overall reliability of the transistors.

In order to overcome such problems, rather than depositing a single layer of stress producing film, the present invention utilizes a dual layer approach. In the first step, a thin layer of stress liner is deposited under low power processes. After that, a relatively thicker layer of stress liner is deposited under high power processes. This approach improves the overall reliability of the transistors without affecting performance.

More specifically, the overall reliability is improved because the lower power initial stress liner has a lower likelihood of damaging the vulnerable areas of the transistor when it is formed. A lower power level creates less damage than a higher power level. The transistor is then protected from being damaged by the second, high power plasma film by the first low-power stress liner. Thus, the invention enjoys all the benefits of increased performance associated with the second, high-power stress liner, without suffering plasma induced damage. The first low-power stress liner is made thick enough to protect the vulnerable portions of the transistor, yet is kept thin enough so that stress from the second high-power stress liner can create stress within the transistor. Thus, the low power film increases the reliability of the transistor by preventing the transistor from being exposed to the subsequent high-power plasma processing.

As shown in flowchart form in FIG. 1, an embodiment of the invention provides a method of producing a MOSFET, or other similar transistor structure having such beneficial features. The method creates a transistor by patterning a gate structure over a substrate 100. As is well-known by those ordinarily skilled in the art, such gate structures can include gate oxides, gate conductors, gate caps, etc. Next, spacers (e.g. oxide or nitride, etc.) are formed on sides of the gate structure 102, and conductor regions (e.g., source, drain, etc.) are formed within the substrate on alternate sides of the gate stack 104. Again, the processing necessary to form such structures is well-known in the art. The details of forming field effect transistors and stress producing layers in well-known in the art and the details of such structures and associated processing is omitted herefrom for brevity. For example, see U.S. Patent Publications 2006/0160317 and 2006/0214225 (incorporated herein by reference) which discuss the details of transistors and stressing layers in detail. The gate structure and the conductor regions make up the transistor.

In order to reduce high power plasma induced damage, the method initially applies a first plasma having a first power level to the transistor to form a first stress layer over the transistor 106. After the first lower-power plasma is applied, the method then applies a second plasma having a second power level to the transistor to from a second stress layer over the first stress layer 108.

The first low-power stress liner is made thick enough to protect the vulnerable portions of the transistor, yet is kept thin enough so that stress from the second high-power stress liner can create stress within the transistor. The invention is not limited to any specific thickness measurement of the first or second layers. Instead, each different type of transistor will benefit from a specific thickness of first and second layers that can be discovered using routine experimentation and can vary according to designer's requirements for stress and damage minimization.

Similarly, the specific power levels utilized will vary depending upon the size of the transistor, its design, the desired characteristics, and other matters and the invention is not limited to any specific power levels. However, the difference between the first and second power level is not a trivial difference, but instead is substantial. For example, the second power level is at least 5 times that of the first power level. Therefore, for example, if the first power level were 5 Watts, the second power level would be at least 25 Watts and could be substantially higher. The various contacts, isolation regions, etc. can then be formed to complete the transistor structure in item 110.

One feature of the invention is that the first plasma and the second plasma have the same chemical structure (yet are applied at different power levels). Thus, the first stress layer and the second stress layer comprise similar materials (e.g., both provide compression or both provide tensile forces). The plasma processes both comprise high density plasma (HDP) processes.

Figure 2:
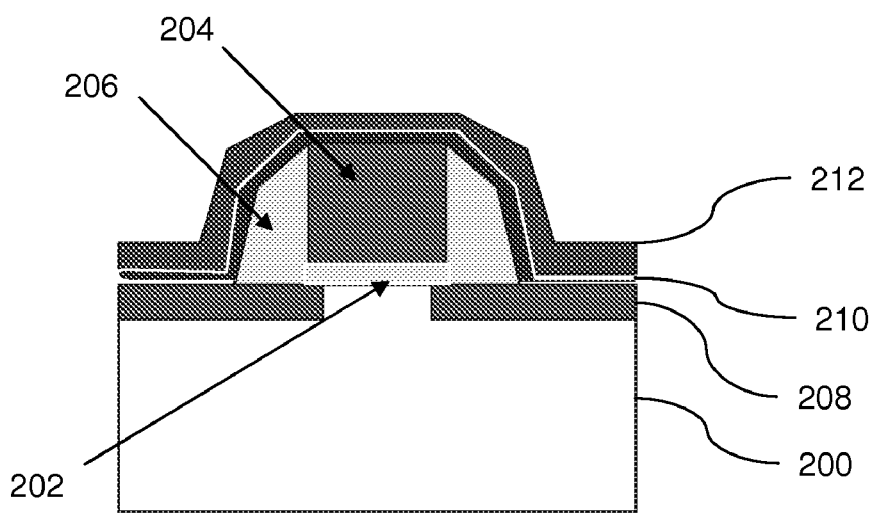
FIG. 2 illustrates a schematic diagram of a transistor with two stress layers according to the present invention.

The resulting structure is shown in FIG. 2. More specifically, item 200 illustrates the substrate, and items 202, 204 represent the gate structure. Item 204 comprise a gate conductor and item 202 comprise a gate oxide. As discussed above, the formation of the gate structure corresponds to flowchart item 100. Item 206 represents the spacers which are formed in item 102 of the flowchart. The conductor regions are illustrated as item 280 and correspond to step up 104 of the flowchart. Item 210 represents the first, lower-power stress-inducing layer and is formed in step 106. Item 212 represents the second, high-power stress-inducing layer that is formed in step 108.

Thus, as shown above, the overall reliability of such transistors is improved because the lower-power, initial stress liner has a lower likelihood of damaging the vulnerable areas of the transistor when it is formed. A lower power level creates less damage than a higher power level. The transistor is then protected from being damaged by the second, high power plasma film by the first low-power stress liner. Thus, the invention enjoys all the benefits of increased performance associated with the second, high-power stress liner, without suffering plasma induced damage.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of producing a metal oxide semiconductor field effect transistor (MOSFET), said method comprising:
   patterning a gate structure over a substrate;
   forming spacers on sides of said gate structure;
   forming conductor regions within said substrate on alternate sides of said gate structure, wherein said gate structure and said conductor regions comprise a transistor;
   applying a first plasma having a first power level to said transistor to form a first stress layer over said transistor; and
   applying a second plasma having a second power level to said transistor to form a second stress layer over said first stress layer,
   wherein said second power level is at least 5 times said first power level.

2. The method according to claim 1, wherein said first plasma and said second plasma have the same chemical structure and different power levels, such that said first stress layer and said second stress layer comprise similar materials.

3. The method according to claim 1, wherein said applying of said first plasma and said applying of said second plasma comprise high density plasma (HDP) processes.

* * * * *